United States Patent
Nicolas

(10) Patent No.: US 7,434,736 B2
(45) Date of Patent: Oct. 14, 2008

(54) SECURING DEVICE FOR A SECURITY MODULE CONNECTOR

(75) Inventor: Christophe Nicolas, Préverenges (CH)

(73) Assignee: NagraCard SA, Cheseaux-sur-Lausanne (FR)

( * ) Notice: Subject to any disclaimer, the term of this patent is extended or adjusted under 35 U.S.C. 154(b) by 618 days.

(21) Appl. No.: 10/535,853

(22) PCT Filed: Dec. 17, 2003

(86) PCT No.: PCT/IB03/06046

§ 371 (c)(1),
(2), (4) Date: May 20, 2005

(87) PCT Pub. No.: WO2004/057519

PCT Pub. Date: Jul. 8, 2004

(65) Prior Publication Data

US 2006/0055506 A1    Mar. 16, 2006

(30) Foreign Application Priority Data

Dec. 20, 2002    (CH) ................................... 2179/02

(51) Int. Cl.
*G06K 19/06* (2006.01)
(52) U.S. Cl. ...................................... 235/492
(58) Field of Classification Search .................. 235/492
See application file for complete search history.

*Primary Examiner*—Karl D. Frech
*Assistant Examiner*—Tae W Kim
(74) *Attorney, Agent, or Firm*—Harness, Dickey & Pierce, P.L.C.

(57) ABSTRACT

The aim of this invention is to control the change of a security module and deactivate the apparatus in the event of the non-authorized removal or replacement of said module. A protection device for a security module connector is proposed, said connector forming part of an acceptor placed on a printed circuit board and integrated into an apparatus whose functioning, controlled by a processor, depends on the security module connected to the acceptor. The device comprises a first part made up of a label attached in a way to block the security module on the printed circuit board, said label including at least one chip and a first antenna. The device further comprises a second part positioned in the vicinity of the connector, said part including a second antenna of a transducer in communication with the apparatus processor. The chip of the label is able to exchange digital signals by means of the first antenna with the second antenna.

12 Claims, 2 Drawing Sheets

SECURING DEVICE FOR A SECURITY MODULE CONNECTOR

FIELD OF THE INVENTION

This invention concerns an electronic and mechanical device that allows the detection of the removal and replacement of a security module inserted into a connection socket.

BACKGROUND OF THE INVENTION

A security module is understood to mean a smart card with contacts serving to control data transfer towards a receiver. The security module, connected to the receiver, is in general removable. It serves to verify the authorization of data processing by supplying the digital keys necessary for the functioning of the receiver. The smart card can notably have dimensions defined by standards ISO 7816 or be of a more reduced size similar to that of a SIM card, particularly used in mobile telephones.

For example, a Pay-TV decoder is equipped with a security module in the form of a smart card. The role of the decoder is to decrypt an audio/video digital data stream according to the rights granted to a subscriber stored in the security module. The data stream can only be decrypted if these rights are valid. More precisely, decryption is carried out when the key contained in the module is valid and allows the decryption of the control words CW contained in the control messages ECM accompanying the data of the stream.

In certain applications, the security module is intended to be definitively inserted into an apparatus, in theory without ever being removed from the apparatus thereafter. In the case of apparatus maintenance or repair, a change of security module will then be carried out under the control of the organization having delivered the module. This is the case, for example, with Pay-TV decoders, where a decoder is supplied to a user at the same time as a security module in the form of a chip card of various dimensions.

In this type of context, two cases are possible, namely:
- the user must introduce the module in question into the decoder once. In this case, it is usually not necessary to extract it.
- the security module is irreversibly introduced into the decoder during manufacture without even the user being informed that the decoder contains a module which must be extracted only by an authorized person.

In general, a decoder is supplied under the conditions of the first case, since the majority of the security modules originate from a different source than the decoder itself. The latter is equipped with standardized connection means, accepting the security modules in the form of ISO 7816 format chip cards or SIM cards, which allow easy module insertion by any user.

Therefore, it is also easy to withdraw the cards from the socket or acceptor in which they are connected by exerting traction on a part of these cards. This kind of manipulation is not in general desirable and furthermore not authorized by the organization or the operator supplying charged decrypting rights. In fact, the operator wishes to avoid the exchanges of security modules from one decoder to another or the replacement of the module by a third module.

A known method for averting the unauthorized withdrawal of a security module is to mechanically block the latter in the acceptor and if extraction is attempted, the blocking means or the manipulation of the acceptor provoke the destruction of the module. Patent application WO 01/39101 describes connectors for security module acceptors provided with different blocking and destruction means such as:

- blocking by an instantaneous adhesive discharge at the point of insertion of the module into the connector.
- destruction by subjecting acceptor contacts to high electrical voltage or localized heating to high temperature of the module during an extraction attempt.
- blocking of the module by anchorage points in the connector which retain the previously weakened module by means of grooves on its surface. Withdrawal leads to its mechanical destruction.

The common factor in the irreversible insertion devices of security modules described above is the destruction of the module in the case of withdrawal. Furthermore, in certain cases, it is even not possible to re-insert a new module into the acceptor since the connector is also damaged, particularly in the case of blocking by adhesive or in the case of destruction by electric or thermal action.

SUMMARY OF THE INVENTION

The aim of this invention is to avoid this drawback by allowing the control of the changing of the security module and deactivating the apparatus in case of non-authorized module removal or replacement.

The aim is achieved by a securing device for security module connector, said connector forming part of an acceptor positioned on a printed circuit board and integrated into an apparatus whose functioning, controlled by a processor, depends on the security module connected to the acceptor, characterized in that it includes a first part made up of a label attached in such a way that it blocks the security module on the printed circuit board, this label having at least one chip and a first antenna and a second part positioned in the vicinity of said connector, said second part including a second antenna of a transducer in communication with the apparatus processor, the chip of the label being able to exchange digital signals by means of the first antenna with the second antenna.

The label of the first part of the device is attached in such a way as to seal the security module previously placed in the acceptor. In general, this is made up of a pre-cut paper or plastic film covered on a large part of its surface by an antenna made up of a wire or of a conductor path connected to a chip. The transducer of the second part of the device, fixed in general, can comprise either an antenna incorporated onto a label attached onto the connector of the security module, or an antenna printed on the printed circuit supporting the connector. The role of the transducer is to establish a dialogue with the first label's chip by electromagnetic means. Thus, an attempt to remove the first label provokes the tearing of the film and the cut-off of the antenna conductor leading to a break in communication with the transducer antenna. This interruption is then detected by the processor of the apparatus, which will be disabled. Only an authorized person can restart the apparatus by replacing the destroyed first label, the security module can be conserved.

BRIEF DESCRIPTION OF THE DRAWINGS

The invention will be better understood thanks to the following detailed description that refers to the enclosed drawings, which are given as a non-limitative example, in which.

DETAILED DESCRIPTION OF THE INVENTION

Figure 1:
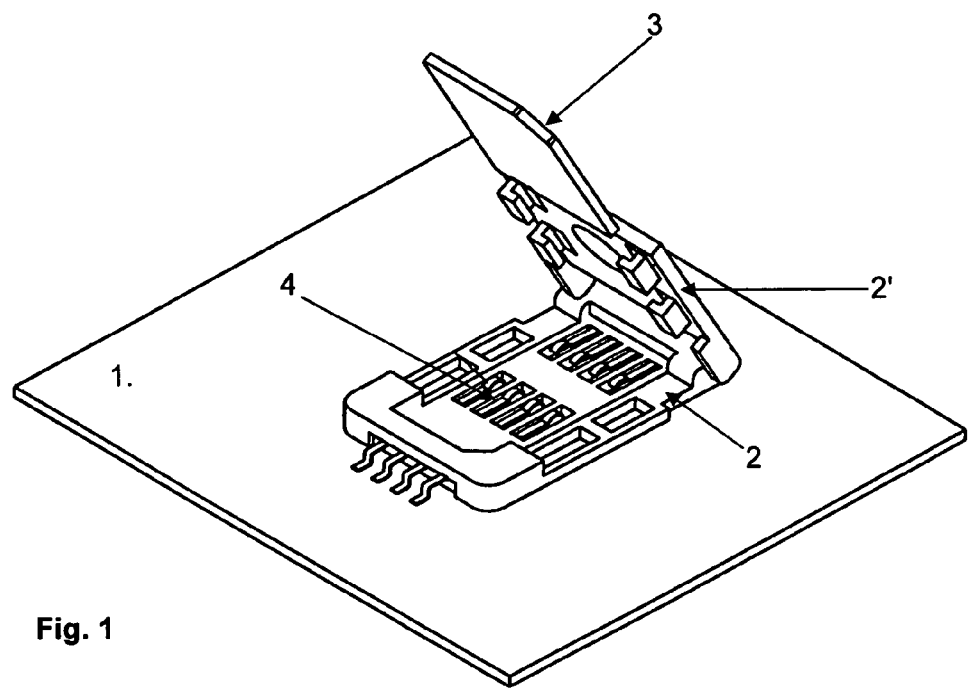
FIG. 1 shows the insertion of a SIM card into an acceptor

FIG. 1 represents a security module acceptor, which is in the form of a socket (2) placed on a printed circuit board (1) corresponding, for example, to the decoder mother board. This socket (2) provided with a cover (2') articulated on one of its sides includes runners into which a security module (3) is introduced. In the illustrated example, the size of the security module corresponds to that of a SIM card with one face equipped with eight contact surfaces. The latter are directed towards eight contacts (4) corresponding to the socket (2) for coming into connection when the cover (2') is placed over the socket (2) and closing the acceptor in order to allow the security module (3) to be set into operation.

Figure 2:
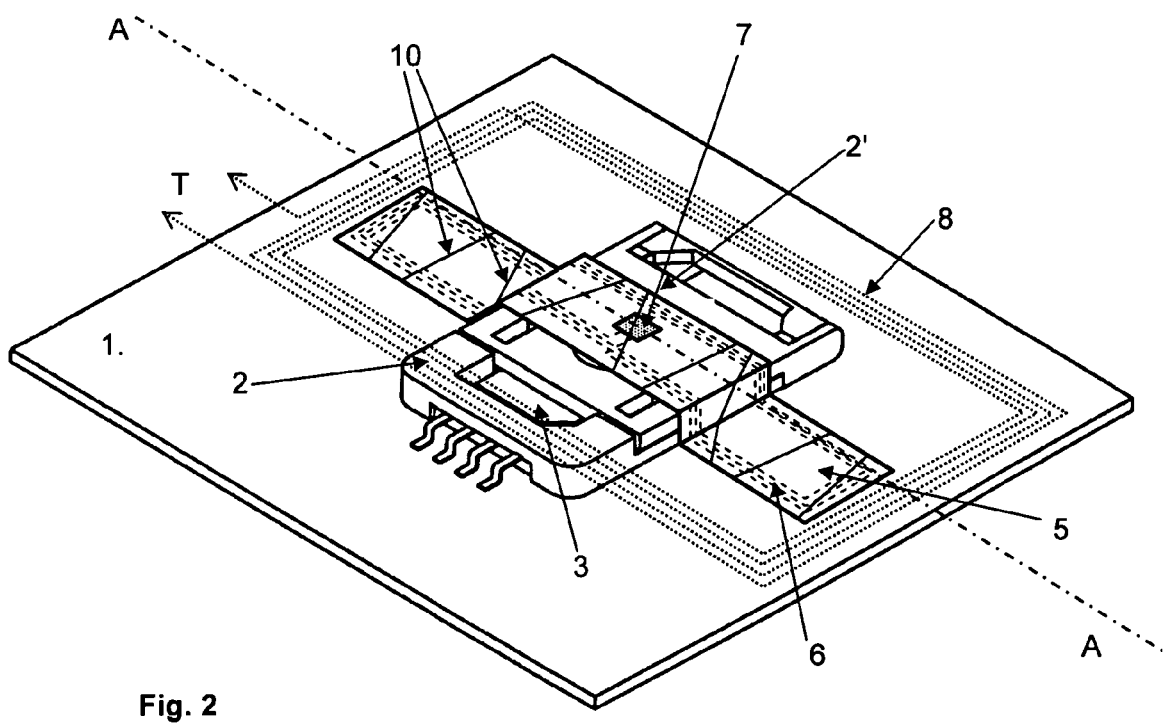
FIG. 2 shows a closed SIM card acceptor provided with the securing device.

FIG. 2 shows an example of the securing device configuration according to the invention whose first part is a label (5) placed over the cover of the acceptor and the second part, a transducer whose antenna coil (8) is placed under the acceptor. Once the acceptor is closed, a label (5) is simultaneously attached onto the support cover of both sides of the latter on the printed circuit in such a way as to seal the acceptor. This label (5) made from a film of insulating material includes a conductor path (6) connected to a chip (7). The path forming a coil extends from one end of the label to the other. Furthermore, the insulating film is covered with grooves (10), which constitute weak points allowing the label to be easily torn in an attempt to remove the latter. The conductor path that can be made in the form of a metallic wire is incorporated into the insulating sheet of the card and connected to the chip (7). It constitutes an antenna calibrated to a service frequency so that any length change provoked by its breakage due to the removal of the label is detected by the antenna coil (8) of the transducer. The latter is placed in the immediate vicinity of the label, and in general under the acceptor, emitting an electromagnetic field allowing energy to be supplied to the label's chip and the exchange of digital signals. The coil (8) is connected to the electronic circuit of the transducer (T), which is connected to the processor via an adequate interface. The signals flowing in the coil (8) of the transducer comprise a unique identification number originating from the chip (7) of the label (5). The processor periodically analyses this number so it can be compared with a reference registered at the time of the installation of the security module (3) in the acceptor. When the results of the comparison are positive, the apparatus operates normally which means that the security module (3) is really the one initially foreseen.

On the other hand, an erroneous or impossible comparison is due either to a spontaneous label change or to the destruction of the latter by an attempted removal. In fact, a new label is immediately detected since its chip contains an identification number different to that previously stored in the memory. The absence of a label or a label whose conductor path working as antenna is damaged is also detected by the processor because the comparison with the reference number is no more possible. The functioning of the apparatus is thus suspended until a complete restart is carried out by the maintenance service with the new installation of a security module.

Figure 3:
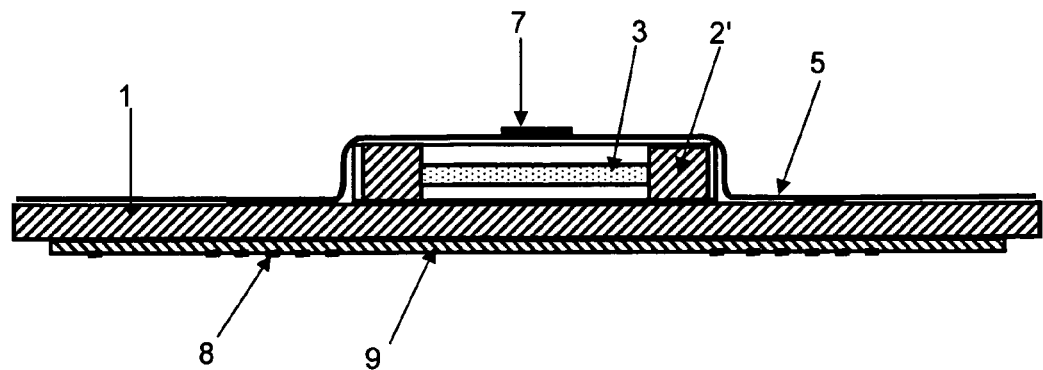
FIG. 3 shows a cross-section of the acceptor in FIG. 2

FIG. 3 represents a schematic cross-section of the device in FIG. 2 according to the axis A-A. The antenna coil (8) of the transducer is in general incorporated into a film made from insulating material (9) forming a second label attached under the acceptor on the opposite face of the printed circuit board (1).

According to another embodiment of the device of the invention, the second label can include grooves similar to those of the first label with the aim of weakening the device. This supplementary protection prevents access to the security module through the lower faceplate of the acceptor by lifting the label for example. A break in the antenna coil of the transducer following the removing of the second label will have the same consequences as the breakage of the conductor path of the first label.

The labels of the device according to the invention can be positioned indifferently on either of the faces of the printed circuit board. In the illustrated example, the label carrying the antenna coil of the transducer can also be placed on the acceptor cover and the label carrying the chip can be placed on the printed circuit board's opposite face. In such a configuration, the label closing the acceptor will include weakening grooves.

Figure 4:
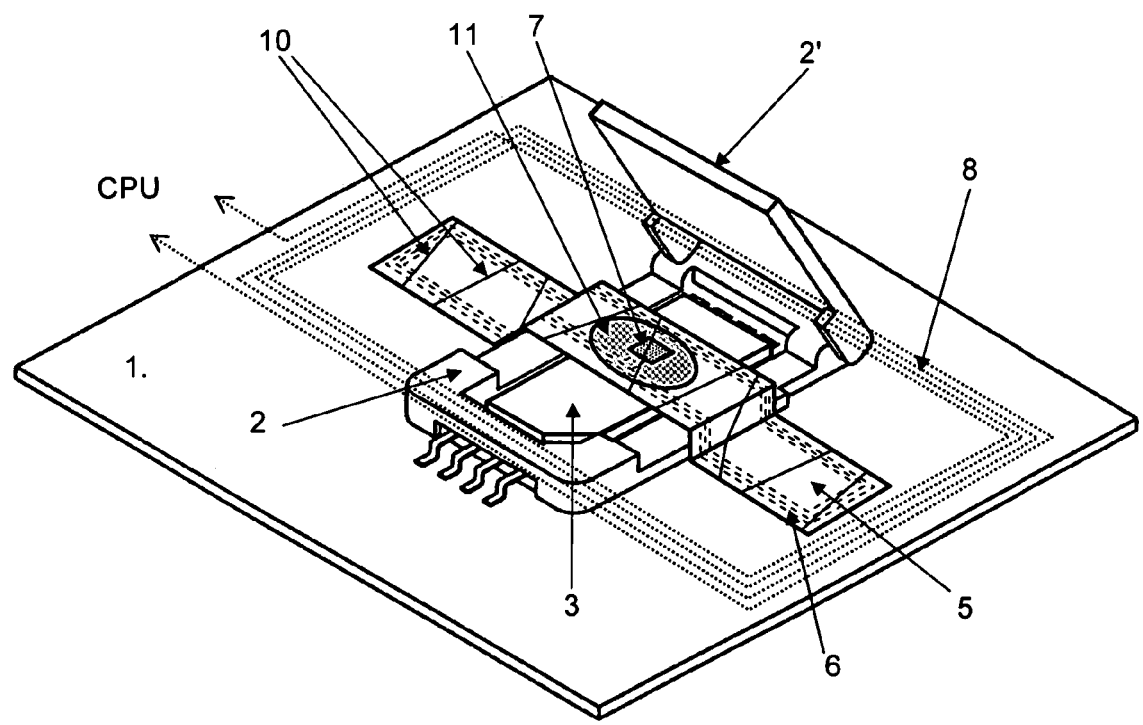
FIG. 4 shows a variant of a SIM card acceptor and the positioning of the securing device.

FIG. 4 shows an embodiment variant of the SIM card acceptor and another possibility for positioning the label (5) provided with the chip (7). The security module (3) is inserted into the socket (2) of the acceptor then the label (5) is attached both onto the security module (3) and onto the printed circuit board (1) on each side of the socket (2). A drop of adhesive (11) is deposited on the label in the area occupied by the chip (7) and finally the cover (2') is placed over the socket (2) in such a way as to close the acceptor. Thanks to the glue (11) adhering the cover (2) to the label, the opening of said cover (2) provokes the tearing of the label (5) together with the breaking of the antenna (6).

According to another embodiment of the invention, the antenna coil of the transducer can be an integral part of the printed circuit and etched (or stamped) at the same time as the other paths of the circuit.

Regardless of the positioning of the device, the extraction of the security module damages one of the labels by interrupting a conductor acting as an antenna. This defect is detected by the processor of the apparatus resulting in its disablement.

The invention claimed is:

1. Securing device for security module connector, said connector forming part of an acceptor positioned on a printed circuit board and integrated into an apparatus whose functioning, controlled by a processor, depends on the security module connected to the acceptor, said device includes a first part made up of a label attached in such a way that it blocks the security module on the printed circuit board, said label having at least one chip and a first antenna and a second part positioned in the vicinity of said connector, said second part including a second antenna of a transducer in communication with the apparatus processor, the chip of the label being able to exchange digital signals by means of the first antenna with the second antenna.

2. Device according to claim 1, wherein the label includes grooves facilitating the tearing of said label if any removal is made.

3. Device according to claim 1, wherein the label is made up of a film of insulating material incorporating a conductor path serving as an antenna and a chip, said antenna being linked to the chip.

4. Device according to claim 1, wherein the antenna of the transducer is placed under the acceptor.

5. Device according to claim 4, wherein the antenna of the transducer is made in the form of a thin film and includes grooves facilitating the tearing of the latter if any attempt is made to remove it.

6. Device according to claim 1, wherein the antenna of the transducer is made in the form of an antenna coil etched on the printed circuit board.

7. Device according to claim 1, wherein the antenna of the transducer is able to send an electromagnetic field allowing a supply of energy to the label's chip and the exchange of digital signals by means of the first antenna.

8. Device according to claim 7, wherein the signals flowing into the antenna of the transducer comprise a unique identification number originating from the chip via the first antenna, the processor being able to periodically analyze said number and to compare it with a reference registered during the installation of the security module in the acceptor.

9. Device according to claim 8, wherein the result of the comparison acts on the functioning of the apparatus controlled by the processor.

10. Device according to claim 9, wherein a positive result from the comparison guarantees the normal functioning of the apparatus.

11. Device according to claim 1, wherein a break in the label antenna or in the transducer antenna provokes the disablement of the apparatus.

12. Device according to claim 1, wherein a spontaneous change of the label including the chip provokes the disablement of the apparatus.

* * * * *